(12) United States Patent
Ting

(10) Patent No.: US 7,789,683 B2
(45) Date of Patent: Sep. 7, 2010

(54) CARD CONNECTOR HAVING EJECTING MECHANISM

(75) Inventor: Chien-Jen Ting, Tu-cheng (TW)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 155 days.

(21) Appl. No.: 12/151,539

(22) Filed: May 7, 2008

(65) Prior Publication Data
US 2008/0280468 A1 Nov. 13, 2008

(30) Foreign Application Priority Data
May 7, 2007 (TW) .............................. 96116055 A

(51) Int. Cl.
*H01R 13/62* (2006.01)
(52) U.S. Cl. .................... 439/159; 439/541.5
(58) Field of Classification Search ................ 439/630, 439/631, 541.5
See application file for complete search history.

(56) References Cited

U.S. PATENT DOCUMENTS

| | | | |
|---|---|---|---|
| 5,655,918 A * | 8/1997 | Soh | 439/541.5 |
| 6,033,243 A * | 3/2000 | Kajiura | 439/159 |
| 6,077,119 A * | 6/2000 | Yu et al. | 439/607.37 |
| 7,040,908 B2 * | 5/2006 | Kamata | 439/541.5 |
| 7,090,537 B1 | 8/2006 | Nakamura | |
| 7,396,239 B2 * | 7/2008 | Harasawa et al. | 439/136 |

FOREIGN PATENT DOCUMENTS

| | | |
|---|---|---|
| CN | 2770143 Y | 4/2006 |
| CN | 1822439 A | 8/2006 |
| CN | 2809963 Y | 8/2006 |
| TW | 314665 | 9/1997 |

* cited by examiner

*Primary Examiner*—Briggitte R Hammond
(74) *Attorney, Agent, or Firm*—Andrew C. Cheng; Wei Te Chung; Ming Chieh Chang

(57) ABSTRACT

An electrical card connector (1) for receiving a card, includes an insulating housing (10) receiving a plurality of terminals (4), a shell (11) mounting on the insulating housing defining a guiding space (14) and receiving a guiding portion (34) to guiding the card moving in the guiding space, and an ejecting mechanism (6) assembled on the insulating housing. The ejecting mechanism includes an ejecting plate (63) for ejecting the card from the guiding space, an operation portion (66) and a lever member (62) connecting the operation and the ejecting plate. The lever member forms a center point as the center of rotation thereof, and the center point is outside the guiding space.

15 Claims, 8 Drawing Sheets

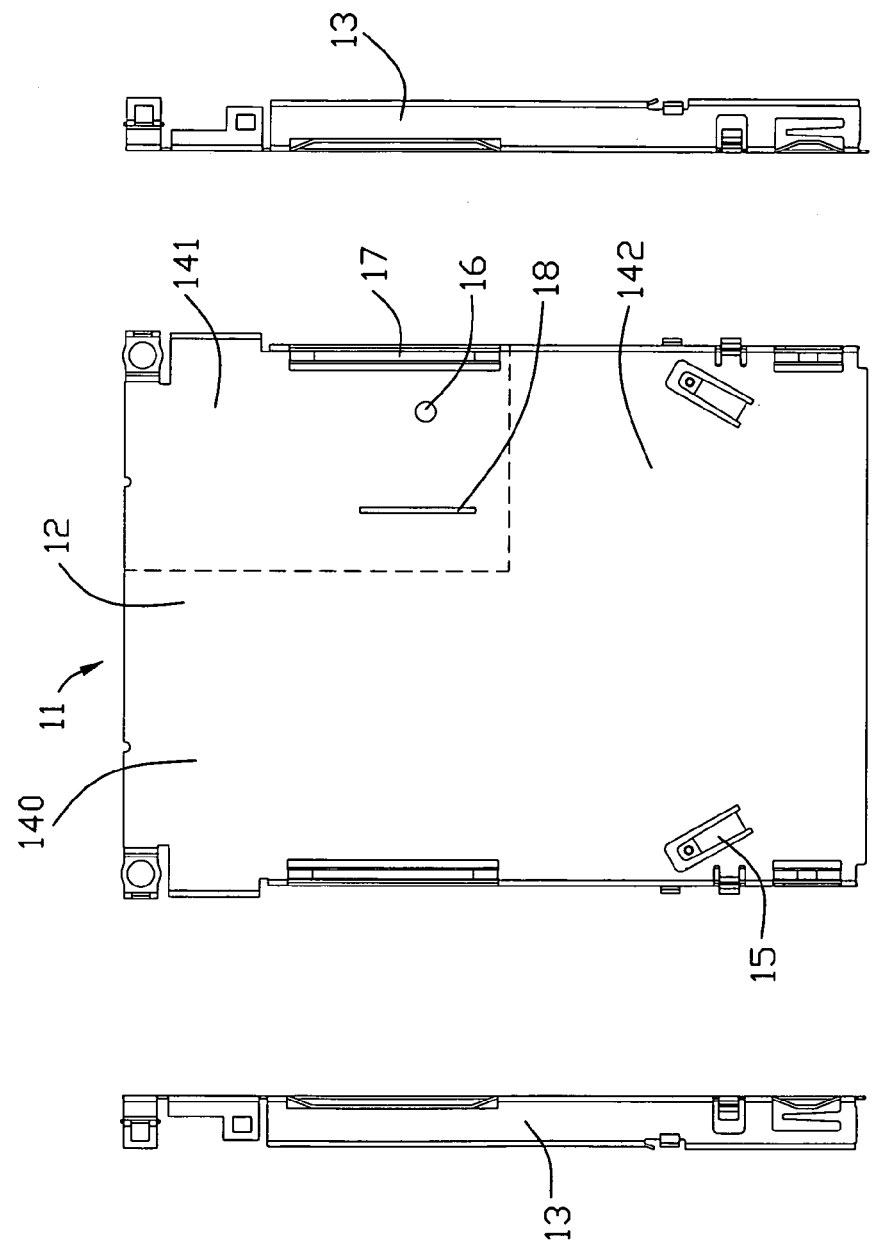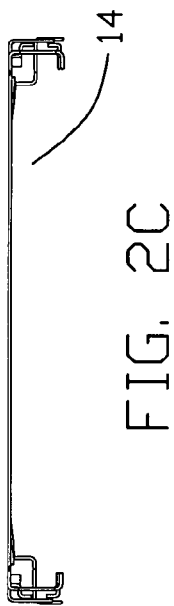

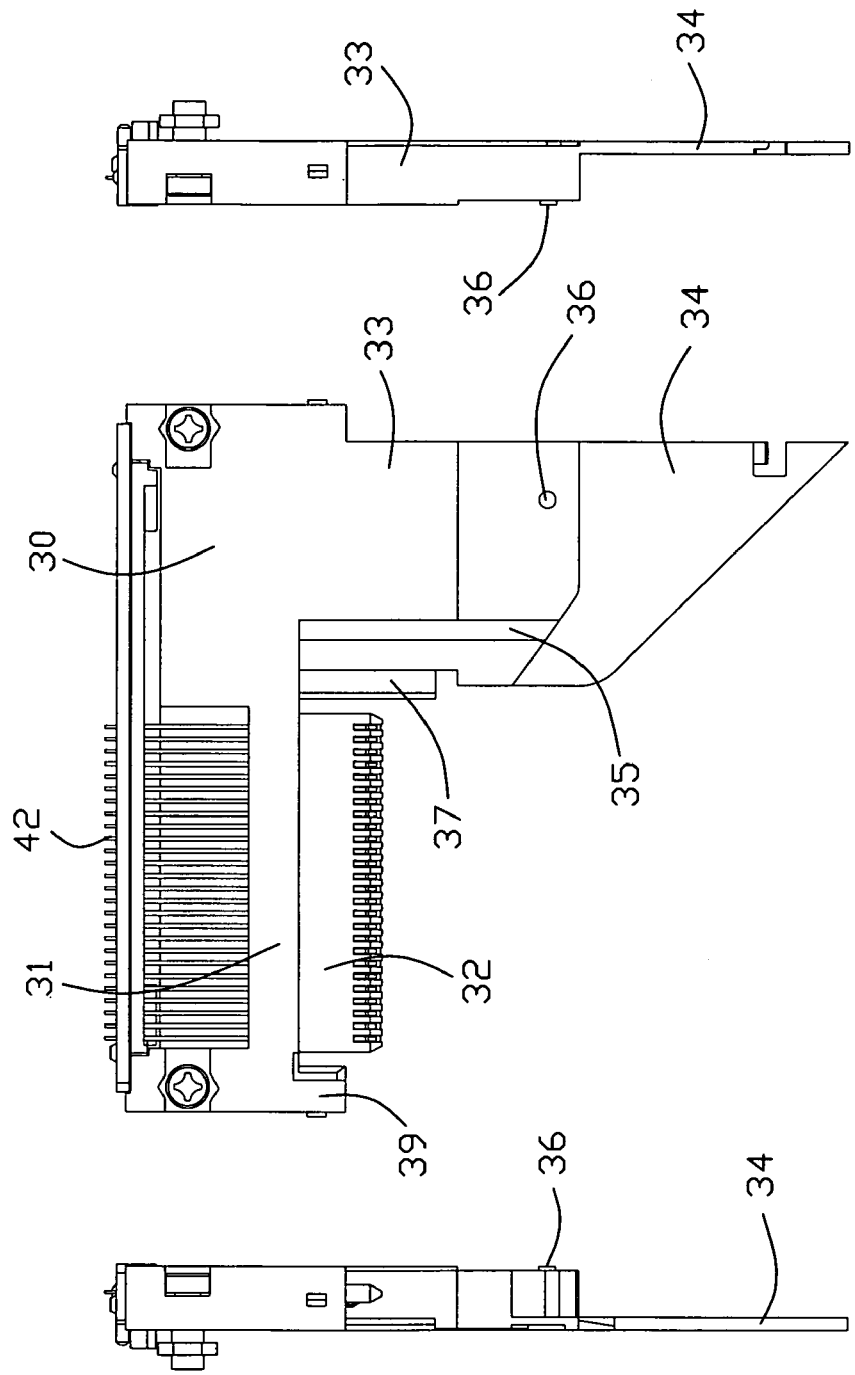

CARD CONNECTOR HAVING EJECTING MECHANISM

BACKGROUND OF THE INVENTION

1. Field of the Invention

The present invention generally relates to a card connector, and more particularly to a card connector having an ejecting mechanism.

2. Description of the Prior Art

Modern times, the PC card is always used as an external equipment for increase the storage of the electrical consumer products, like Mobile phone, Digital camera, etc. The electrical card connector is used for electrically connecting the PC card and the electrical consumer products. An ejecting mechanism is used on the card connector for ejecting the card from the card connector.

The prior art discloses a kind of electrical card connector comprises a L-shape shield plate and an ejecting mechanism assembled on the L-shape shield plate. The L-shape shield plate is used for receiving and guiding a card inserted. The ejecting mechanism used for ejecting the card from the ejecting mechanism, comprises an ejecting plate moving following the card inserting/ejecting, a pushing bar for pushing the ejecting plate, and a lever member located in a guiding space and connecting with the ejecting plate and the pushing bar. However, when the card is inserted into the guiding space, the lever member is overlapped on the card, and easily breaks the surface of the card. Otherwise, the front end of the card has a probability to collide the lever member during inserting cause the incorrect operation.

Hence, it is desirable to have an improved card connector to overcome the above-mentioned disadvantages of the prior art.

BRIEF SUMMARY OF THE INVENTION

Accordingly, the object of the present invention is to provide an electrical card connector having an ejecting mechanism, which prevent the card from collide with the ejecting mechanism during inserting.

In order to achieve the above-mentioned object, an electrical card connector for receiving a card, includes an insulating housing receiving a plurality of terminals, a shell mounting on the insulating housing defining a guiding space and receiving a guiding portion to guiding the card moving in the guiding space, and an ejecting mechanism assembled on the insulating housing. The ejecting mechanism includes an ejecting plate for ejecting the card from the guiding space, an operation portion; and a lever member connecting the operation and the ejecting plate. The lever member forms a center point thereon as the center of the rotation of itself, the center point is beyond the guiding space.

Other objects, advantages and novel features of the invention will become more apparent from the following detailed description of the present embodiment when taken in conjunction with the accompanying drawings.

BRIEF DESCRIPTION OF THE DRAWINGS

FIG. 2(A-D) are a plurality views of the first shell in accordance with the present invention;

FIG. 3(A-D) are a plurality views of the first insulating housing in accordance with the present invention;

DETAILED DESCRIPTION OF THE INVENTION

Figure 1:
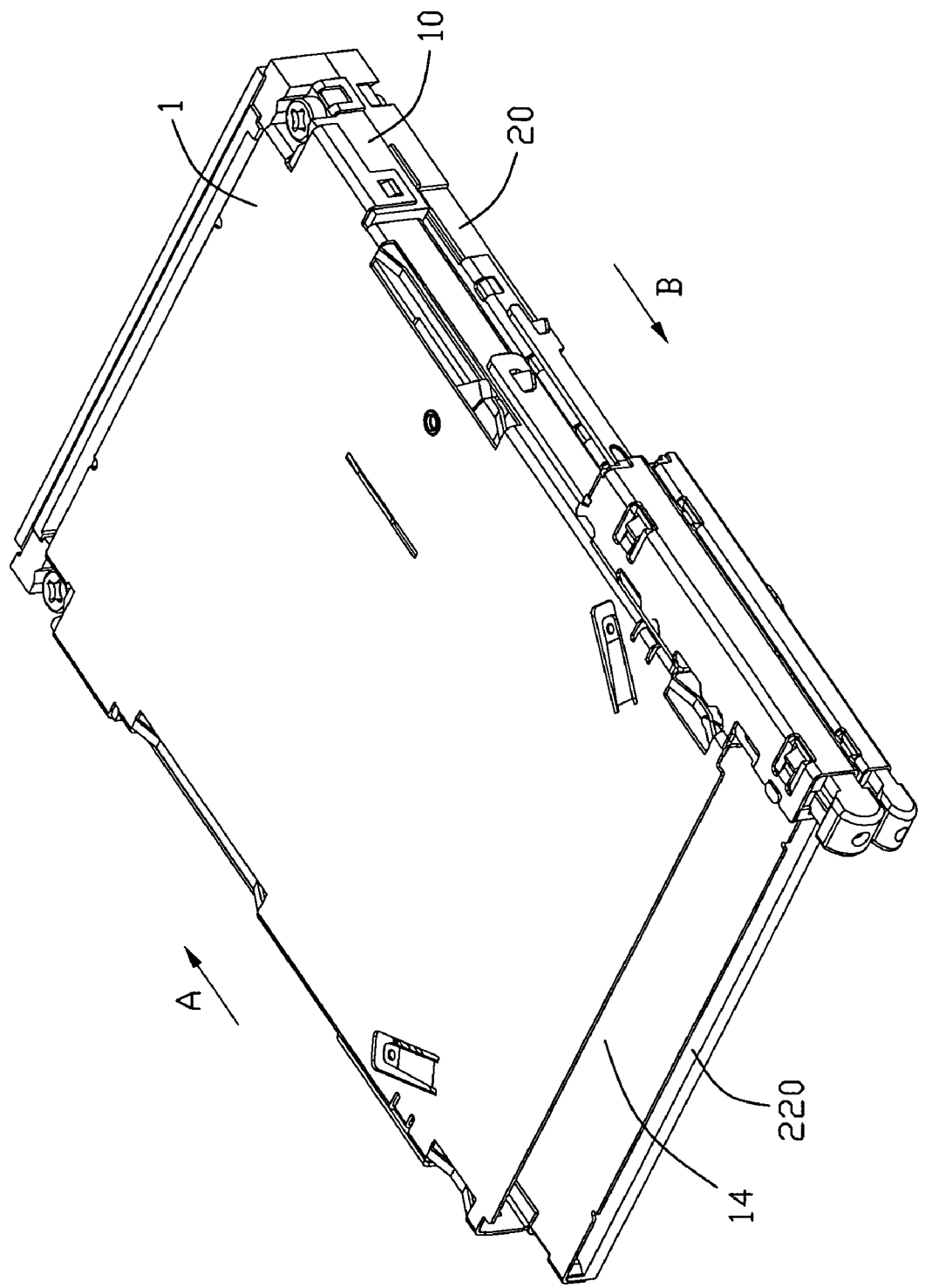
FIG. 1 is a perspective view of an electrical card connector in accordance with the present invention.

Reference will now be made to the drawing figures to describe the present invention in detail.

Referring to FIG. 1, a stacked electrical connector 1 comprises a first card connector 10 and a second card connector 20 under the first card connector 10. The first card connector 10 defines a first receiving space 14 for receiving a first card, and the second card connector 20 defines a second receiving space 220 for receiving a second card. In this embodiment, the first card and the second card are different, accordingly, the speed of signals transmitting of the first card connector 10 is different from that of the second card connector 20.

Referring to FIG. 2-FIG. 5, the first card connector comprises a first insulating housing 30, a plurality of first terminals 4 receiving in the first insulating housing 30, a first metal shell 11 assembled on the first insulating housing 30 and a first and a second ejecting mechanisms 5, 6 assembled on the first insulating housing 30.

The first shell, approximately L-shape, comprises a top wall 12, a pair of lateral walls 13 extending downwardly from the opposite sides of the top wall 12. The first receiving space 14 is surrounded by the top wall 12 and the lateral walls 13. Referring to FIG. 2(A-D) and FIG. 3, The first receiving space 14 is divided into a L-shape receiving space 140 and a rectangular receiving space 141 at the right and upper corner of the L-shape space 140 (shown in FIG. 2A). The L-shape space 140 comprises a guiding space 142 at the right and bottom corner thereof for guiding the first card inserting. The top wall 12 comprises two pressing pieces 15 adjacent to a card inserting open (not labeled) and extending into the first receiving space 14 for pressing on the first card, and two engaging plate 17 at the opposite sides thereof and extending along a card inserting direction A. The engaging plate 17 projects into the first receiving space 14. Otherwise, the top wall 12 defines a slit 18 and a hole 16 between the pair of engaging plates 17 and above the rectangular receiving space 141 correspondingly.

Figure 4:
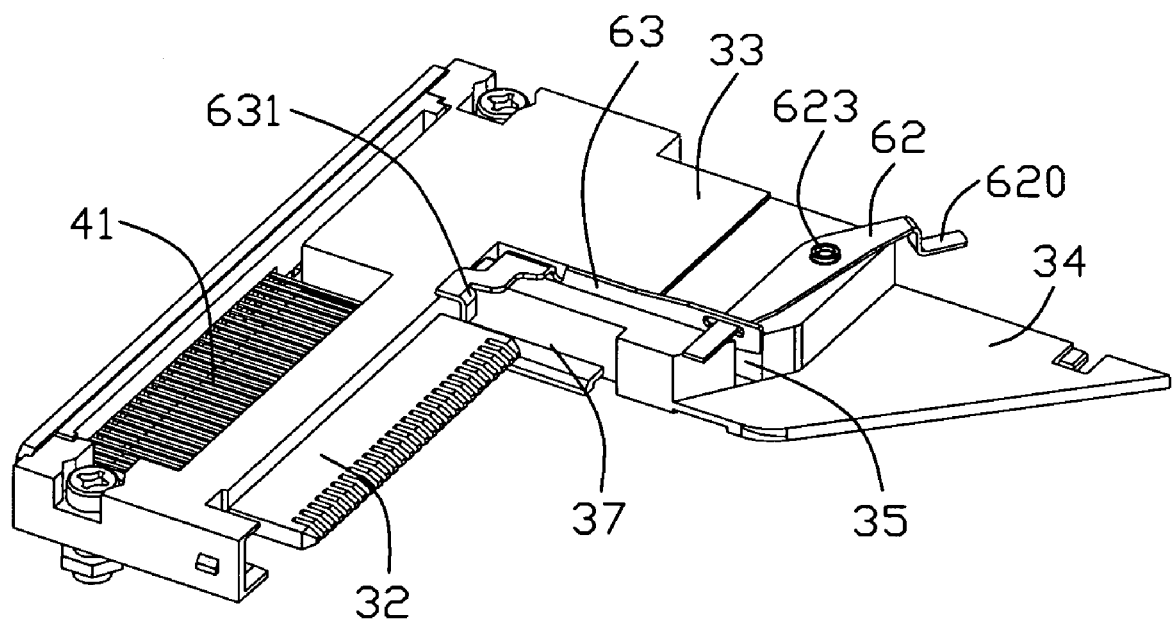
FIG. 4 is a perspective view of some parts of the electrical card connector shown in FIG. 1.
Figure 5:
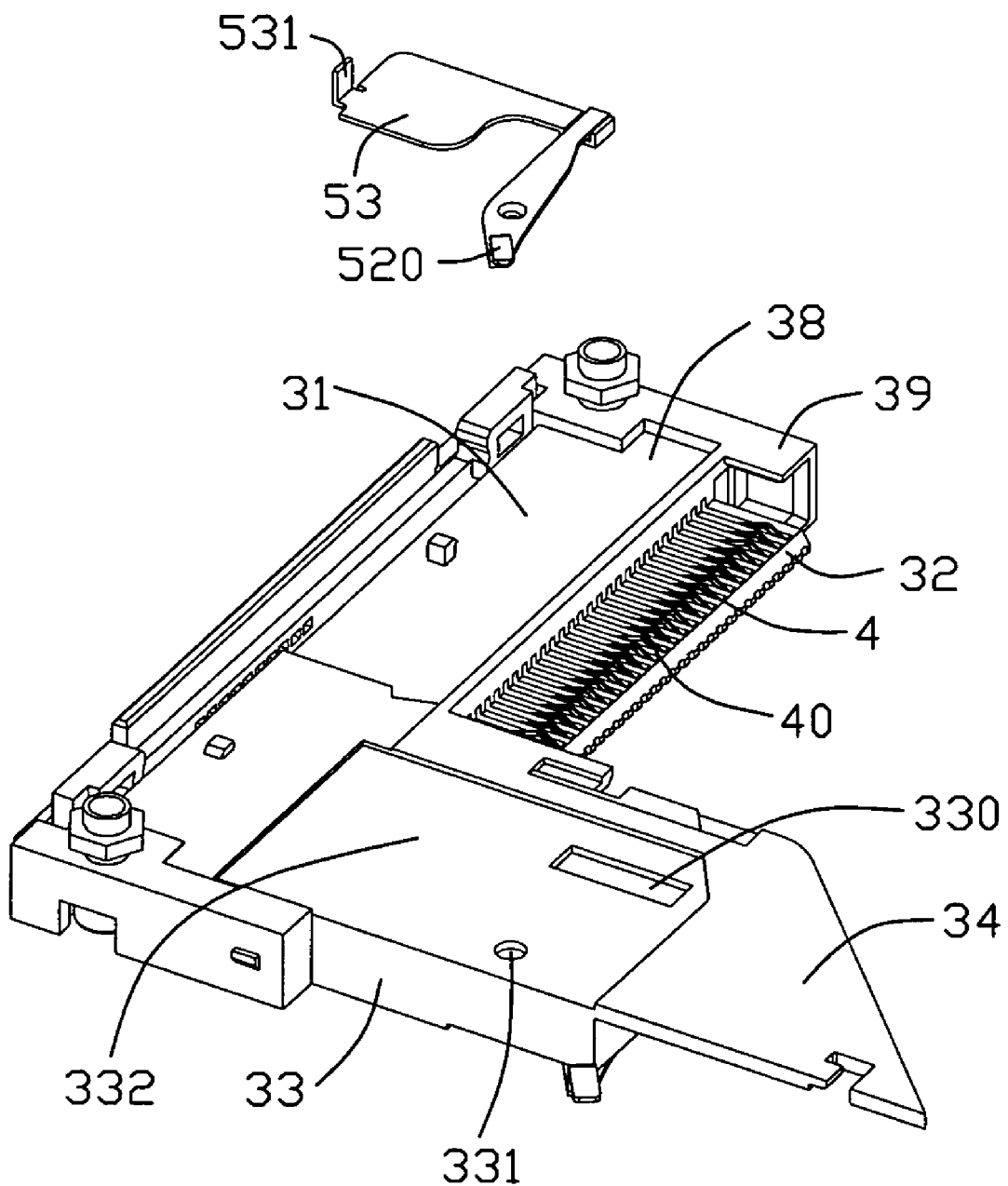
FIG. 5 is a perspective view of some parts of the electrical card connector shown in FIG. 1.

Referring to FIG. 3(A-D) and FIG. 4, the first insulating housing 30 comprises a base 31, a base seat 33 extending from a lateral side of the base 31 in a direction B opposite to the card inserting direction A, and a guiding portion extending from the base seat 33 in the direction B. The width of the base 31 associated with the base seat 33 is approximately equal with the width of the shell 11. The base 31 comprises a main body 38, a supporting arm 39 at a lateral side of the main body 38 opposite to the base seat 33, and a tongue plate 32 from the main body 38 extending in the direction B. A plurality of terminals receiving channels (not labeled) are defined in the base 31 for receiving corresponding first terminals 4. The base seat 33 comprises a projecting point 36 extending upwardly from the surface of thereof, a guiding channel 35 at the left side of the projecting point 36, and ejecting channel 37 between the guiding channel 35 and the tongue plate 32. Otherwise, for remaining the thickness of the whole connector, the surface where the projecting point 36 forms is lower than the rest surface of the base seat 33. Referring to FIG. 5, the base 31 defines a depression portion 332 at the other surface opposite to the projecting point 36. A guiding hole 331 and a guiding slit 330 beside the guiding hole 331 are defined in the depression portion 332. The bevel edge of the triangular guiding portion 34 extends in a certain angle in the first receiving space 141 for guiding the first card inserting.

The first and the second ejecting mechanism 6, 5, respectively, comprise a first and a second ejecting plate 63, 53, a first and a second operation portion 66, 56, and a first and a second lever member 62, 52. The first and the second lever member 62, 52, respectively, forms a certain point. And the first and the second lever member 62, 52 can rotate around the certain point on themselves. Thereby, the user push the operation portion 66, 56 to move the ejecting plate 63, 53 through the lever member 62, 52. The ejecting plate 63, 53 forms a retaining port 630, 530 for connecting with an end of the lever member 62, 52 and a ejecting portion 631, 531 opposite to the retaining port for ejecting the card. The other end of the lever member 62, 52 opposite to the end connecting to the ejecting plate 63, 53 is retained with a mounting port 620, 520 of the operation portion 66, 56. Otherwise, the lever member 62, 52 comprises a projecting center hole 624, 524 and a limiting edge 623, 523 forming circularly along the top edge of the center hole 524, 524. In this embodiment, the center hole 624, 524 is the center point of the lever member 62, 52. The operation portion 66, 56 comprises a button 60, 50, a sliding post 61, 51, and a retaining portion 64, 54, having a push-push type structure therein. Furthermore, the difference between the first ejecting plate 63 and the second ejecting plate 53 is that the first retaining port 63 defines a hole thereon and the second retaining port 53 forms a frame.

Each first terminal 4 comprises a contacting portion 40 extending out of the tongue portion 32, a tail portion 42 extending out of the first insulating housing 30 to soldering with a Printed Circuit Board (PCB) and a connecting portion 41 connecting with the contacting portion 40 and the tail portion 41.

Figure 7:
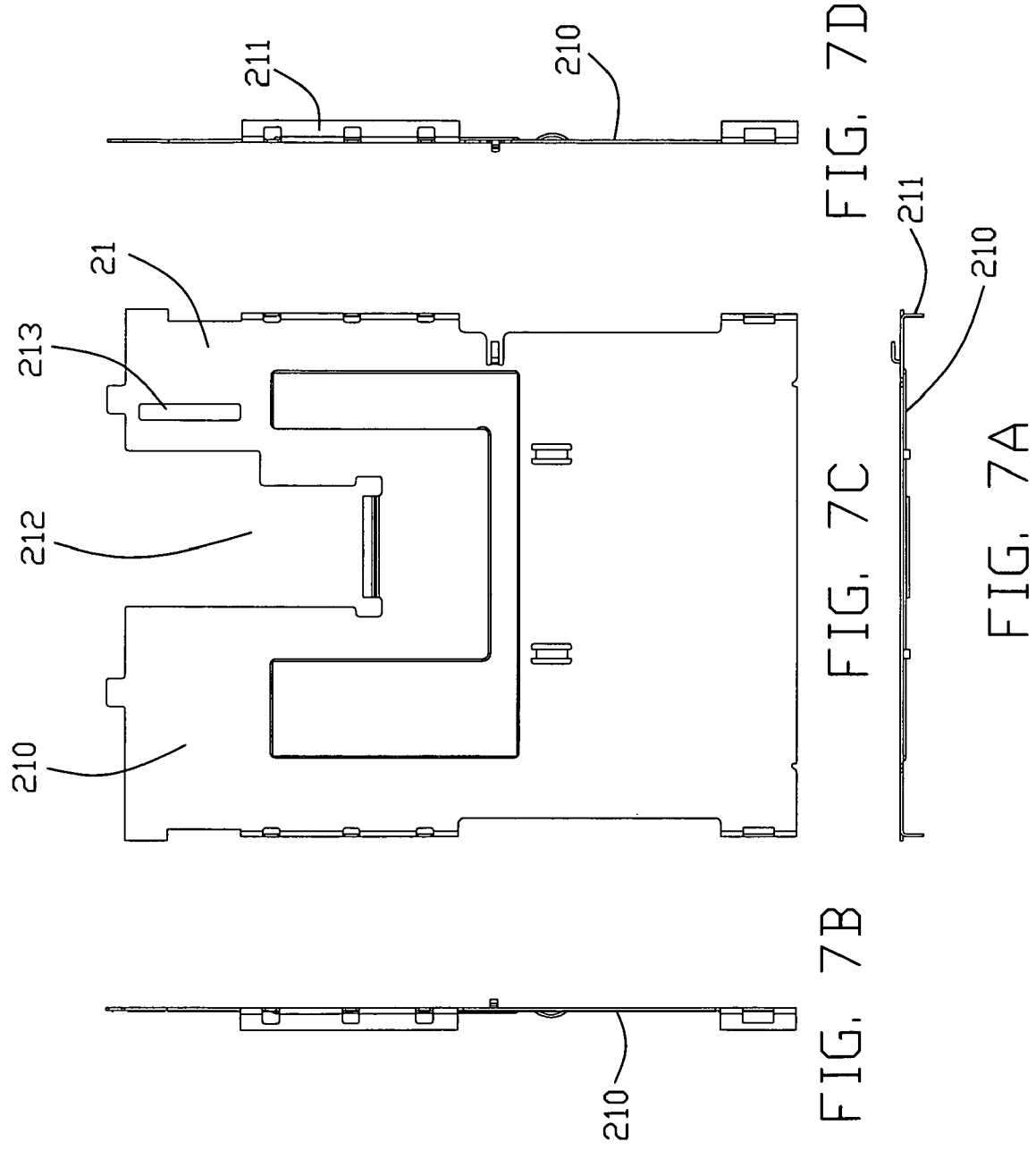
FIG. 7(A-D) are a plurality views of the second shell in accordance with the present invention.
Figure 8:
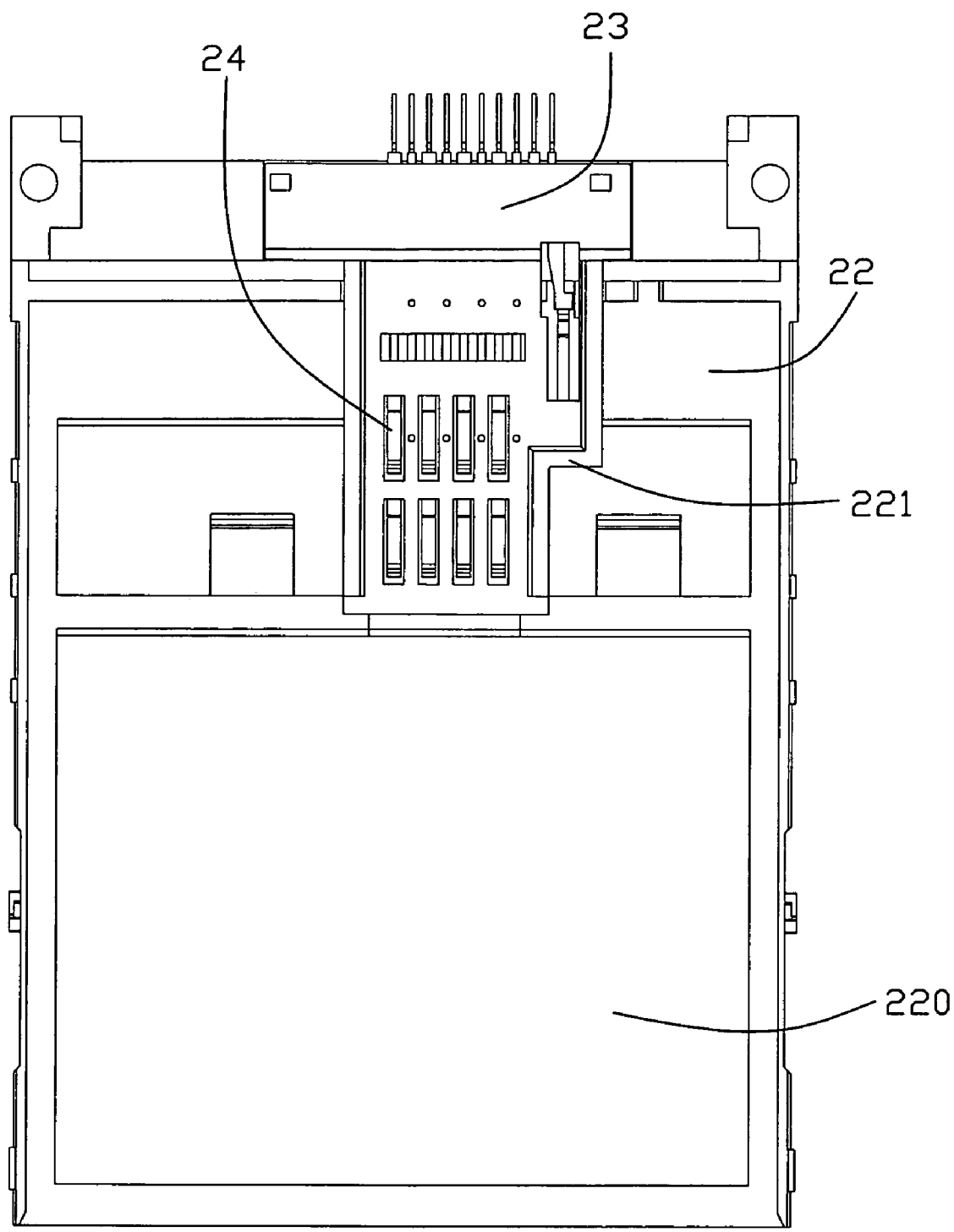
FIG. 8 is a top-elevation view of the second insulating housing in accordance with the present invention.

Referring to FIG. 1 and joining with FIG. 7 and FIG. 8, the second card connector 20, which is under the first card connector 10, comprises a second insulating housing 22, a second terminal module 23, and a second shell 21 covering on the second insulating housing 22. The first card connector 10 is stacked on the second shell 21. The first receiving space 14 and the second receiving space 220 are separated from each other by the second shell 21.

The second shell is configured of rectangle and comprises a top part 210 and a pair of lateral parts 211 extending downwardly from the top part 210. The second receiving space 220 is surrounded by the top part 210 and the lateral parts 211. The top part 210 defines a cutout 212 according to the configure of the second terminal module 23 and a slit beside the cutout 212 for receiving the second ejecting portion 531.

The second insulating housing 22 comprises a depression 221 to receiving the second terminal module 23. The second terminals 24 retained in the second terminal module 23 projects into the second receiving space 220.

Referring to FIG. 1-FIG. 8, during assembly, the second terminal module 23 is received in the second insulating housing 22, and the second shell 21 covers on the second insulating housing 22. The second ejecting mechanism 5 is assembled onto the first insulating housing 10. Both the second ejecting plate 53 and the second lever member 52 are received in the depression portion 332, the second limiting edge 523 is locking with the guiding hole 331, the second part 530 is movably received in the guiding slit 330, and the second operation portion 56 is located on the outside of the second shell 21 by the second retaining portion 54 locking with the lateral part 211. Finally, the first insulating housing 10 with the second ejecting plate 53 is assembled on the second shell 211. The second ejecting portion 531 extends into the second receiving space 220 through the slit 213.

Figure 6:
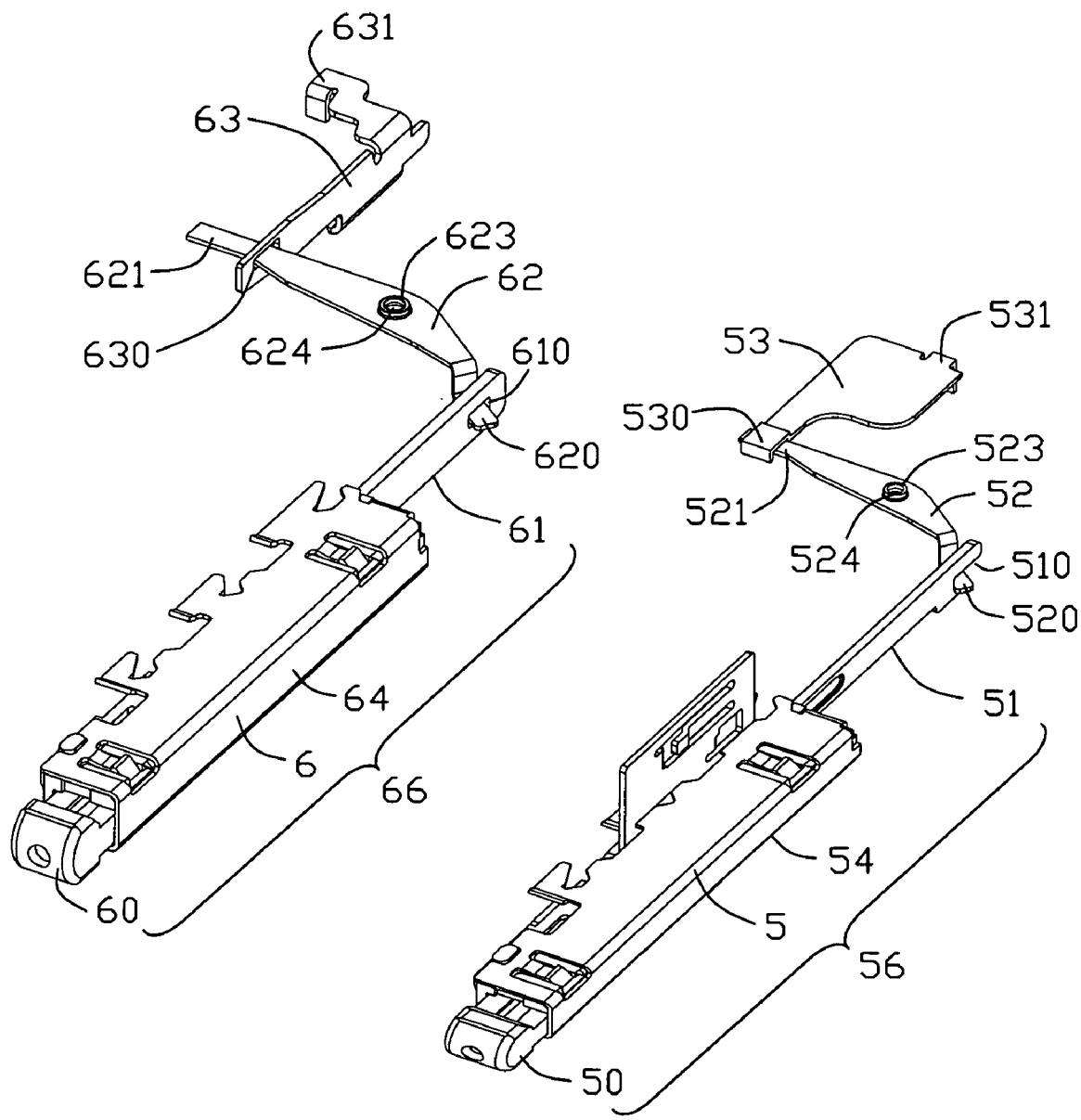
FIG. 6 is a perspective view of the ejecting mechanisms of the electrical card connector shown in FIG. 1.

Referring to FIGS. 1, 4 and 6, the first ejecting mechanism 6 assembled on the first insulating housing 10. The first ejecting plate 63 is received in the guiding channel 35 and capable of moving in the direction A and B. The first ejecting portion 631 extends into the ejecting channel 37. The first lever member 62 is assembled on the projecting point 36. The projecting point 36 locking with the first center hole 624.

The first shell 11 assembled on the first insulating housing 10, the base 31 is located in the L-shape receiving space 140, the base seat 33 is located in the rectangular receiving space 141, the guiding portion 34 is received in the guiding space 142. The first limiting edge 623 of the first lever member 62 extends into the hole 16, and the ejecting plate partially extend into the slit 18. The first operation portion 66 assembled on a lateral wall 13 of the first shell 11 by the first retaining portion 64 locking with the lateral wall 13.

In this invention, the lever member 62, 52 is located out of the guiding space 142 to prevent the card from friction between the card and the lever member 62, 52.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical card connector for receiving a card, comprising:
   an insulating housing comprising a base and a base seat extending from the base, and receiving a plurality of terminals;
   a shell mounting on the insulating housing to define a guiding space and a guiding portion to guide the card moving in the guiding space, the guiding space comprising an L-shape space to leave a rectangular space, the base seat of the insulating housing located in the rectangular space; and
   an ejecting mechanism assembled on the insulating housing, comprising:
   an ejecting plate for ejecting the card from the guiding space;
   an operation portion; and
   a lever member connecting the operation and the ejecting plate, the lever member defining a center point as a center of rotation thereof which is located in the rectangular space.

2. The electrical card connector as claimed in claim 1, wherein the lever member forms a limiting edge, and the shell defines a hole to lock with the limiting edge to form the center of rotation of the lever member.

3. The electrical card connector as claimed in claim 1, wherein the base seat defines a guiding channel, and the ejecting plate is movably received in the guiding channel.

4. The electrical card connector as claimed in claim 1, wherein the base comprises a tongue portion for mating with the card, and the center of rotation of the lever member is formed between the tongue portion and the guiding portion in a card inserting direction.

5. The electrical card connector as claimed in claim 1, wherein the guiding portion of the insulating housing comprises a triangular part received in the guiding space.

6. The electrical card connector as claimed in claim 1, wherein the ejecting plate connects with one end of the lever member, and the other end of the lever member connects with the operation portion.

7. The electrical card connector as claimed in claim 1, wherein the lever member defines a center hole mating with a surface portion of the base seat.

8. The electrical card connector as claimed in claim 7, wherein the surface portion of the base seat is lower than the rest surface of the base seat, and the lever member is located on the surface portion.

9. A card connector assembly, comprising:
 a first card connector and a second card connector stacked on the first card connector;
 the first card connector comprising a shell and an ejecting mechanism, the shell defining an L-shape space and a rectangular space at a corner of the L-shape space;
 the ejecting mechanism comprising an ejecting plate, an operation portion, and a lever member connecting the ejecting plate and the operation portion, the lever member being capable of rotating around a center point thereof, the center point of the lever member being located in the rectangular space.

10. The electrical card connector assembly as claimed in claim 9, further comprising a second ejecting mechanism assembled on the second card connector.

11. The electrical card connector assembly as claimed in claim 10, wherein the first card connector comprises a base seat, the base seat defining a pair of depressions on the opposite surfaces thereof.

12. The electrical card connector assembly as claimed in claim 11, wherein the second ejecting mechanism comprises a second lever member, and the lever member and the second lever member are located at corresponding depressions of the base seat, respectively.

13. The electrical card connector assembly as claimed in claim 11, wherein the base seat is located in the rectangular space.

14. An electrical card connector comprising:
 stacked upper and lower connector ports;
 an upper shell covering the upper connector port;
 a middle shell essentially located between the upper connector port and the lower connector port;
 an upper pivotal type ejection mechanism defining an upper pivot member with a pivot adjacent to the upper shell; and
 a lower pivotal type ejection mechanism defining a lower pivot member with another pivot adjacent to the middle shell.

15. The electrical connector as claimed in claim 14, further including an upper insulative housing essentially located in the first connector port, and both said pivots are located on opposite faces thereof, respectively.

* * * * *